(12) United States Patent
Keyser

(10) Patent No.: US 6,685,484 B2
(45) Date of Patent: Feb. 3, 2004

(54) ELECTRICAL CONNECTOR AND TERMINAL FOR FLAT CIRCUITRY

(75) Inventor: Frank T. Keyser, Elk Grove Village, IL (US)

(73) Assignee: Molex Incorporated, Lisle, IL (US)

( * ) Notice: Subject to any disclaimer, the term of this patent is extended or adjusted under 35 U.S.C. 154(b) by 64 days.

(21) Appl. No.: 09/999,334

(22) Filed: Nov. 1, 2001

(65) Prior Publication Data

US 2003/0082931 A1 May 1, 2003

(51) Int. Cl.[7] ................................................ H01R 12/00
(52) U.S. Cl. ........................................ 439/77; 439/751
(58) Field of Search ............................ 439/75, 74, 78, 439/67, 81–83, 943, 751; 174/262, 263, 266

(56) References Cited

U.S. PATENT DOCUMENTS

| | | | | |
|---|---|---|---|---|
| 2,958,064 A | * | 10/1960 | Swengel | |
| 3,555,497 A | * | 1/1971 | Watanabe | 439/857 |
| 3,573,711 A | * | 4/1971 | Henschen | 439/593 |
| 4,828,503 A | * | 5/1989 | Gilissen et al. | 439/62 |
| 4,997,378 A | * | 3/1991 | Matsuoka | 439/71 |
| 5,548,488 A | * | 8/1996 | Hansen | 361/815 |
| 5,860,817 A | * | 1/1999 | Fieberling | 439/81 |
| 6,071,152 A | * | 6/2000 | Achammer | 439/733.1 |

OTHER PUBLICATIONS

McGraw–Hill Dictionary of Scientific and Technical terms, second edition, 1978, pp. 608, 828, 1282.*

* cited by examiner

Primary Examiner—Tho D. Ta
Assistant Examiner—Larisa Tsukerman
(74) Attorney, Agent, or Firm—Stacey E. Caldwell

(57) ABSTRACT

An electrical connector is provided for a flat circuit which has at least one pin-receiving hole therein and a conductor on a side thereof about the hole. A dielectric circuit support member supports the flat circuit and has a pin-receiving hole in registry with the hole in the flat circuit. A conductive terminal includes a pin portion insertable through the hole in the flat circuit and into the hole in the support member. A wing portion projects laterally of the terminal for engaging the conductor on the flat circuit. The hole in the support member is sized relative to the pin portion of the terminal to establish an interference fit therebetween and to maintain the wing portion in compressive engagement with the conductor of the flat circuit.

20 Claims, 4 Drawing Sheets

FIG. 4
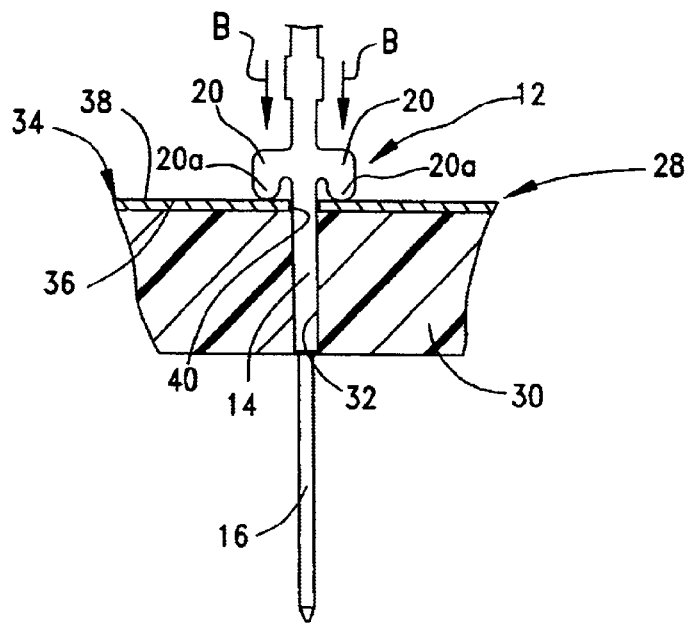
FIG. 5
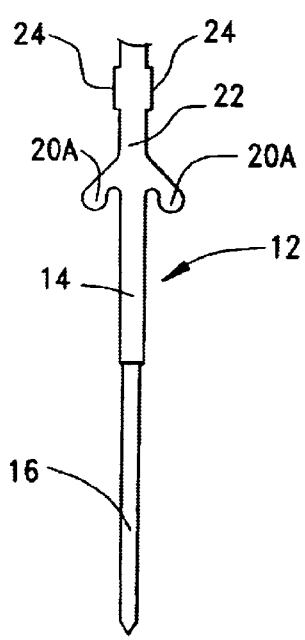
FIG. 6

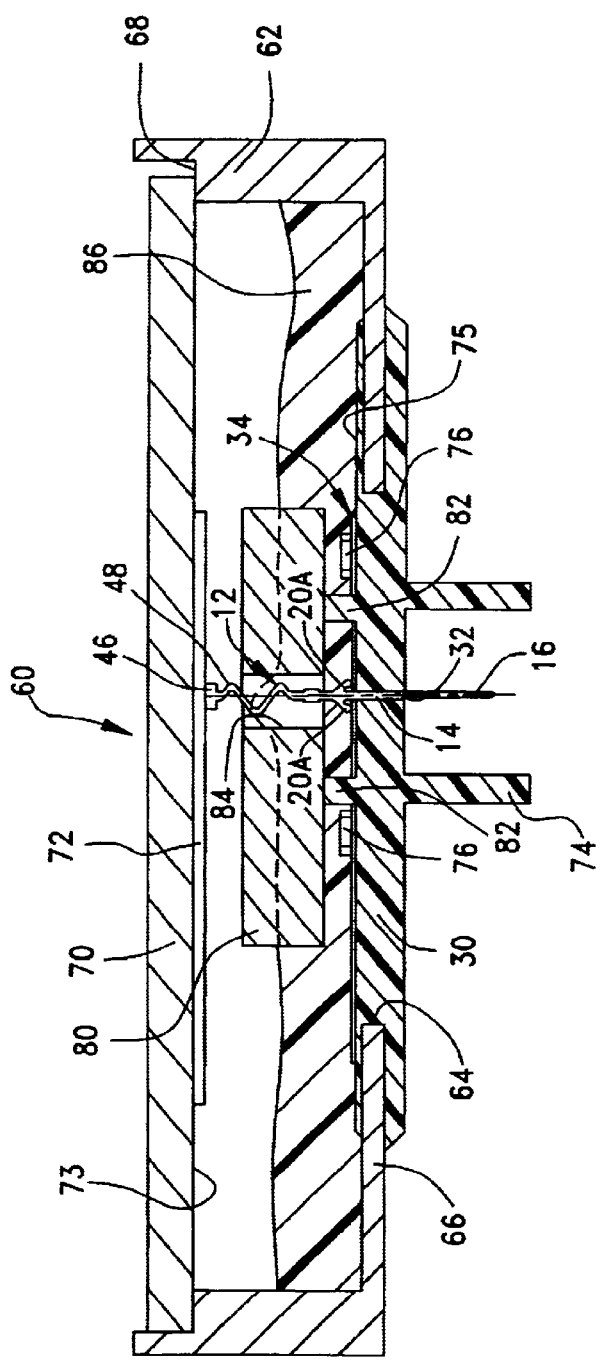
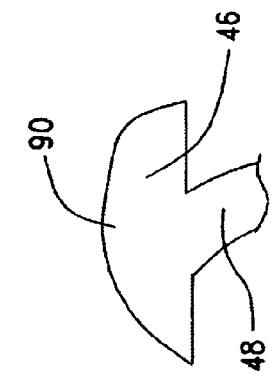
FIG. 11
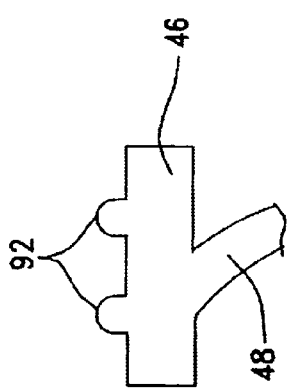
FIG. 12
FIG. 10

ELECTRICAL CONNECTOR AND TERMINAL FOR FLAT CIRCUITRY

FIELD OF THE INVENTION

This invention generally relates to the art of electrical connectors and, particularly, to an electrical connector or electronic device wherein terminal pins are electrically coupled through holes in a flat circuit or substrate, such as a flat flexible circuit, along with a unique structure of the terminals themselves.

BACKGROUND OF THE INVENTION

Numerous electrical connectors have been designed for utilization with a flat circuit which may be mounted directly on the connector or connected in circuit with terminal pins on the connector. An example of a flat circuit is a flat flexible circuit which includes a flat flexible dielectric substrate having one or more holes therein for receiving one or more terminal pins. A ductile conductive film or other circuit trace system is deposited on the substrate in an area at least about the hole or holes. The terminal pins are inserted into the holes in the substrate to establish electrical and mechanical connections between the pins and the flat flexible circuit. Typically, each hole is smaller in diameter than a respective pin. Alternatively, the pin may be punched through the flat flexible circuit to establish the electrical and mechanical connection therewith.

In order to assure good electrical and mechanical connections in these types of electronic devices or electrical connectors, solder or other adhesives often are used. For instance, in U.S. Pat. No. 4,970,624, dated Nov. 13, 1990 and assigned to the assignee of the present invention, uni-axial adhesive is deposited on the flat flexible circuit about the hole which is penetrated by the terminal pin. The adhesive includes a non-conductive base incorporating randomly spaced conductive particles. When the terminal pin is forced through the adhesive, a portion of the adhesive is carried with the terminal pin between the pin and the flat flexible circuit. The carried portion of the adhesive is compressed for establishing contact between the conductive particles and, thereby, conductivity between the terminal pin and the flat flexible circuit, leaving the adhesive other than that portion in a non-conductive state. Such adhesives often are called "Z-axis" adhesives. These adhesive were developed to replace soldering techniques which require specific temperature resistant components and substrates.

Conductive adhesives are used in other applications involving flat flexible circuits. For instance, in U.S. Pat. No. 5,456,616, dated Oct. 10, 1995 and assigned to the assignee of the present invention, the connector housing is fabricated of a die cast metallic material, such as of magnesium, aluminum or the like. The ductile film on the flat flexible circuit is fabricated of a different metallic material, such as copper or the like and, in fact, may be plated with still a different metallic material such as a tin/lead alloy. The conductive film on the flat flexible circuit acts as a ground plane against the rear face of the connector housing. The housing has a plurality of pins which project through holes in the flat flexible circuit. Using a "Z-axis" adhesive between the housing pins and the flat flexible circuit not only is expensive, as described above, but the conductive interface between the different metal components is limited to the areas of pressure. Consequently, that patent teaches the use of an omni-directional conductive adhesive deposited on the conductive film over the areas of the holes therein, the conductive adhesive expanding the conductive interface between the metal housing and the metal ground plane defined by the conductive film.

Although such uses of conductive adhesives, whether the adhesives are Z-axis adhesives or omni-directional adhesives, serve their intended purposes in certain applications, they are relatively expensive both in the cost of the adhesives as well as their methods of use. In addition, the use of either type of conductive adhesive is costly in terms of secondary operations and costs associated with the metal particles, not to mention the problem of clogging adhesive dispensers by the metallic particles.

Because of the problems associated with the use of conductive adhesives, a unique system was devised as disclosed in U.S. Pat. No. 5,384,435, dated Jan. 24, 1995 and assigned to the assignee of the present invention. That patent solves the problems with conductive adhesives by establishing an electrical connection directly between the terminal pin and the flat conductor on the flat flexible substrate by controlling various parameters between the pin and the substrate. Although this system has proven quite effective, there remains a continuing problem in electrical connectors or electronic devices wherein the pins are very closely spaced, i.e., in very high density connectors. In particular, if the interference between a pin and the substrate produces a stress in the substrate, the stress is magnified in high density applications and results in what is called a systematic stress that causes stress concentrations and can even result in substrate fractures. The present invention is directed to solving this myriad of problems in an extremely simple manner by producing an electrical connection between a contact pin and a flat circuit exclusively by compression which results in no stress being imparted to the substrate of the flat circuit. This unique system can be used in a wide variety of applications as will be seen herein.

SUMMARY OF THE INVENTION

An object, therefore, of the invention is to provide a new and improved electrical connector for a flat circuit.

Another object of the invention is to provide a new and improved terminal for use with flat circuits.

In the exemplary embodiment of the invention, the connector and the terminal are used with a flat circuit having at least one pin-receiving hole therein and a conductor on a side thereof about the hole. The connector includes a dielectric circuit support member for supporting the flat circuit on one side thereof, with the conductor of the circuit facing away therefrom. The support member has a pin-receiving hole for registry with the pin-receiving hole in the flat circuit.

A conductive terminal is provided with a pin portion insertable from the one side of the support member through the hole in the flat circuit and into the hole in the support member. The terminal includes a laterally projecting wing portion for engaging the conductor on the flat circuit. The invention contemplates that the hole in the support member be sized relative to the cross-dimensions of the pin portion of the terminal to establish an interference fit therebetween and to maintain the wing portion of the terminal in compressive engagement with the conductor of the circuit. Therefore, the circuit is not in any way deformed which might cause stresses therein.

As disclosed herein, the circuit support member is fabricated of plastic material and the terminal is fabricated of metal material. The terminal may be stamped of conductive sheet metal material, including a pair of the wing portions projecting laterally from opposite sides thereof.

The terminal defines a longitudinal axis running lengthwise through the pin portion thereof. In one embodiment of the invention, the wing portion or portions are formed at an angle to the axis and at an angle to the flat circuit to provide a spring characteristic in the wing portions. In another embodiment, a resilient layer is sandwiched between the flat circuit and the one side of the support member.

According to one aspect of the invention, the terminal includes a contact pin extending coaxially from the pin portion of the terminal beyond an opposite side of the support member for interconnection to a contact of an appropriate complementary connecting device. The cross-dimensions of the contact pin are less than the size of the hole in the circuit support member so that the contact pin does not engage the inside of the hole when the pin portion of the terminal is inserted into the hole. This arrangement will prevent any plating on the contact pin from being scraped off of the pin when inserted into the hole.

According to another aspect of the invention, the terminal includes a head portion joined to the pin portion by a spring portion extending away from the one side of the circuit support member. The head portion is configured for engaging a conductor of a complementary electrical device. For instance, the head portion may have a flat surface generally parallel to the one side of the circuit support member for engaging a conductor of a second flat circuit.

Finally, with the terminal being stamped of sheet metal material, the terminal can be stamped with at least one laterally projecting shoulder portion spaced from the wing portion of the terminal. The shoulder portion can be used for engagement by an appropriate tool to facilitate inserting the pin portion of the terminal into the hole in the circuit support member.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 4 is a section through an electrical connector device incorporating the terminal of FIG. 1;

FIG. 5 is a side elevational view of a second embodiment of a terminal according to the invention;

FIG. 6 is a view similar to that of FIG. 4, but incorporating the terminal of FIG. 5;

FIG. 10 is a section through another embodiment of a connector assembly incorporating the terminal of FIG. 8;

FIG. 11 is a fragmented elevational view of a different configuration of the head portion of the terminal; and FIG. 12 is a fragmented elevational view of a further configuration of the head portion of the terminal.

DETAILED DESCRIPTION OF THE PREFERRED EMBODIMENTS

Figure 1:
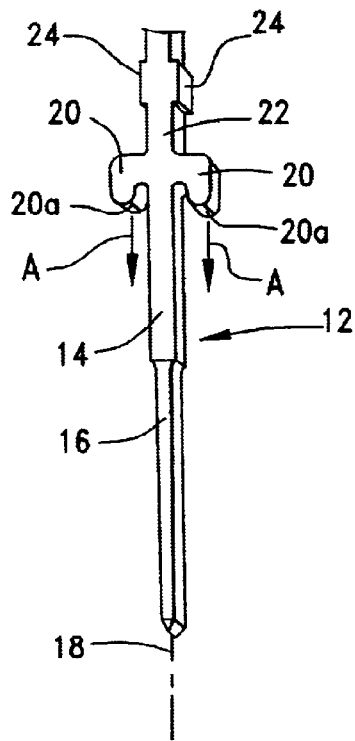
FIG. 1 is a perspective view of one embodiment of an electrical terminal incorporating the concepts of the invention.
Figure 2:
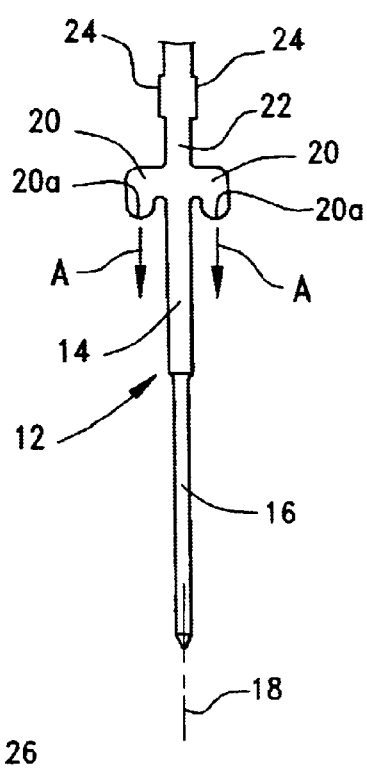
FIG. 2 is a side elevational view of the terminal of FIG. 1.

Referring to the drawings in greater detail, and first to FIGS. 1 and 2, one embodiment of a conductive terminal, generally designated 12, is shown according to the invention. The terminal is stamped of conductive sheet metal material and includes a pin or mounting portion 14 having a contact pin 16 projecting coaxially from the pin portion at one end thereof. Contact pin 16 may be plated with gold or other highly conductive material. The entire terminal defines a longitudinal axis 18 running coaxially through pin portion 14 and contact pin 16. A pair of wing portions 20 project laterally from pin portion 14. The wing portions are generally L-shaped and define contact tips 20a which face in the direction of arrows "A" toward contact pin 16 generally parallel to axis 18. A body portion 22 projects coaxially of pin portion 14 on the opposite side of wing portions 20, and a pair of shoulders 24 are formed during the stamping of the terminal to project laterally outwardly thereof.

Figure 3:
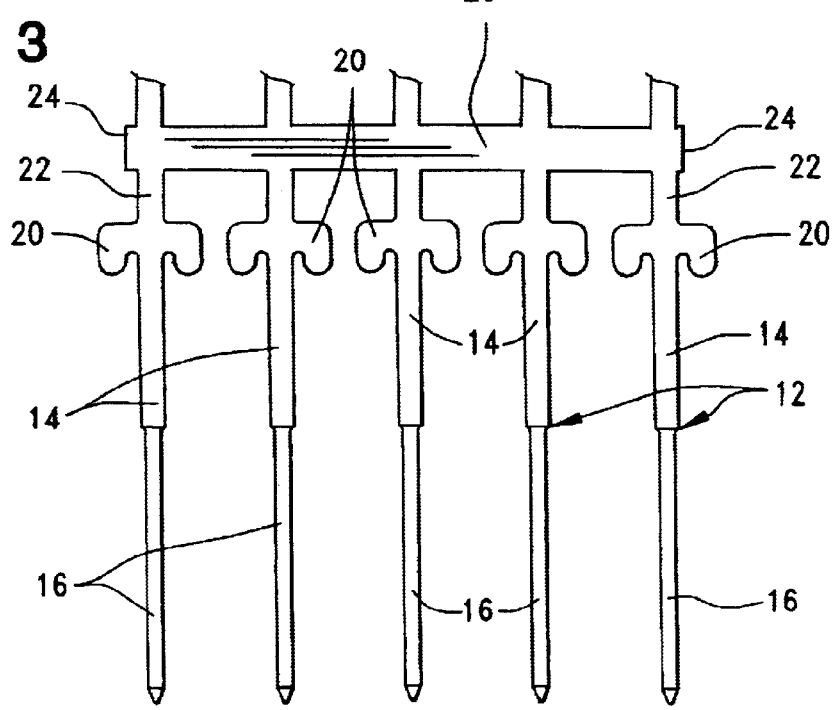
FIG. 3 is a plan view of a plurality of the terminals of FIG. 1 having been stamped from sheet metal material and still joined by a carrier strip.

FIG. 3 shows a plurality of terminals 12 having been stamped from a sheet of conductive metal material, with the terminals still being joined by a carrier strip 26 of the sheet metal material. The carrier strip may be used to gang-load a plurality of the terminals into a connector. On the other hand, carrier strip 26 can be severed to form laterally projecting shoulders 24 (FIGS. 1 and 2). These shoulders can be used for engagement by an appropriate tool to facilitate inserting the terminals individually into a connector.

FIG. 4 shows one of the terminals 12 assembled in an electrical connector, generally designated 28. The connector includes a dielectric circuit support member 30 which may be a shroud, for instance, of an electrical connector assembly. The support member may be molded of plastic material. The support member includes a through hole 32. A flat circuit, generally designated 34, is adhered to the top of support member 30. The circuit includes a flat dielectric substrate 36 having a conductor 38 on the top thereof. For instance, flat circuit 34 may be a flat flexible circuit which includes a flat flexible dielectric substrate 36 having a ductile conductive film or other circuit trace system 38 deposited on the substrate in an area at least about a hole 40 in the substrate.

At this point, it should be understood that the Figures herein show a single terminal being used in various electrical connectors or connecting devices. This has been done in order to provide a clear and concise understanding of the concepts of the invention. However, as stated in the "Background", above, the invention has considerable utility and advantages in use with a high density connector arrangement, i.e., a connector which uses a plurality of terminal pins in closely-spaced arrays.

With that understanding, the single terminal 12 shown in FIG. 4 is assembled in connector 28 by inserting contact pin 16 and pin portion 14 through hole 40 in flat circuit 34 and into hole 32 in support member 30 in the direction of arrows "B". It can be seen that the cross-dimensions of contact pin 16 are less than the cross-dimensions of pin portion 14 and, particularly, less than the size of hole 32 in support member 30. This helps to avoid scraping contact pin 16 within the hole during the insertion process to prevent any plating on the contact pin from being scraped off of the pin during assembly. In addition, hole 40 in flat circuit 34 also may be larger than pin portion 14 so that no stresses whatsoever are created in substrate 36 of the circuit.

The invention contemplates that hole 32 in dielectric circuit support member 30 be sized relative to the cross-dimensions of pin portion 14 of terminal 12 to establish an interference fit therebetween. In other words, the pin portion is larger than the hole in the plastic support member. Therefore, when terminal 12 is inserted into the hole to the position shown in FIG. 4, support member 30, in essence, grips pin portion 14 of the terminal because of the interference fit of the pin portion within the hole. The terminal is inserted in a manner to positively engage contact tips 20a of wing portions 20 with conductor 38 of flat circuit 34 by a compressive force. Because of the interference fit between support member 30 and pin portion 14 of the terminal within hole 32, this interference fit is effective to maintain the contact tips of wing portions 20 in compressive engagement with conductor 38 of the flat circuit.

FIGS. 5 and 6 show another embodiment of a terminal 12 which includes wing portions 20A which are configured differently from wing portions 20 in the embodiment of FIGS. 1–4. Otherwise, like reference numerals are used in FIGS. 5 and 6 corresponding to like components described above and shown in FIGS. 1–4.

More particularly, wing portions 20A of the embodiment of the terminal shown in FIGS. 5 and 6 are formed at an angle to axis 18 of the terminal as well as at angle to flat circuit 34 and conductor 38. These angled wing portions provide a spring characteristic therein to facilitate maintaining the compressive engagement between contact tips 20a of the wing portions with conductor 38 as pin portion 14 of the terminal is gripped within hole 32 of plastic support member 14.

Figure 7:
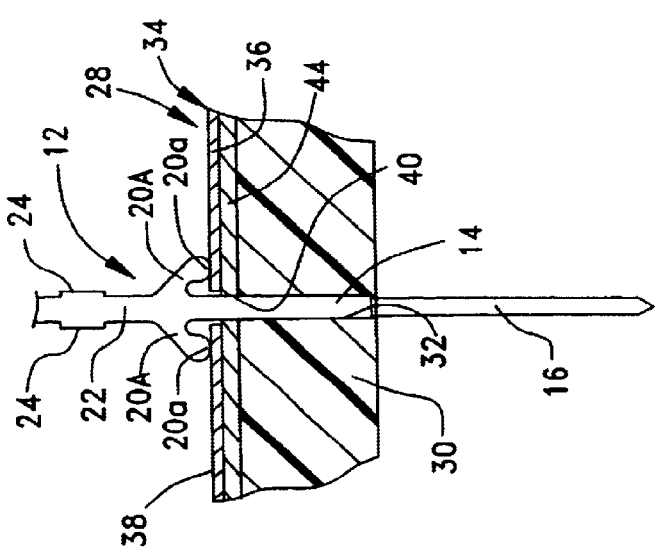
FIG. 7 is a view similar to that of FIG. 6, but with the connector incorporating a resilient layer between the flat circuit and the terminal support.

FIG. 7 shows a further embodiment wherein angled wing portions 20A again are used with terminal 12. However, in this embodiment, a resilient layer 44 is sandwiched between substrate 36 of flat circuit 34 and dielectric circuit support member 30. This resilient layer adds a further spring characteristic to the overall assembly to enhance the compressive engagement between contact tips 20a of wing portions 20A and conductor 38 of the flat circuit as pin portion 14 of the terminal is griped within hole 32 of the support member.

Figure 8:
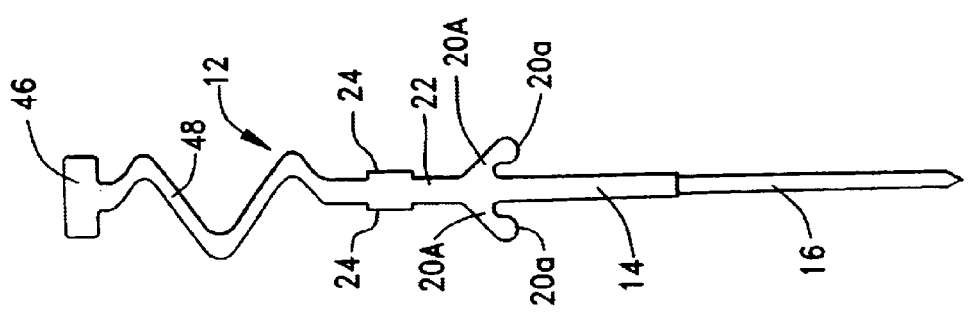
FIG. 8 is a side elevational view of the terminal of FIG. 5, with the terminal completed to incorporate a spring-supported head.

FIG. 8 shows the embodiment of terminal 20 illustrated in FIGS. 5–7, with the terminal completed to include a head portion 46 at an end of the terminal opposite contact pin 16. Head portion 46 is joined to pin portion 14 by a spring portion 48 which is stamped in a "wave" configuration.

Figure 9:
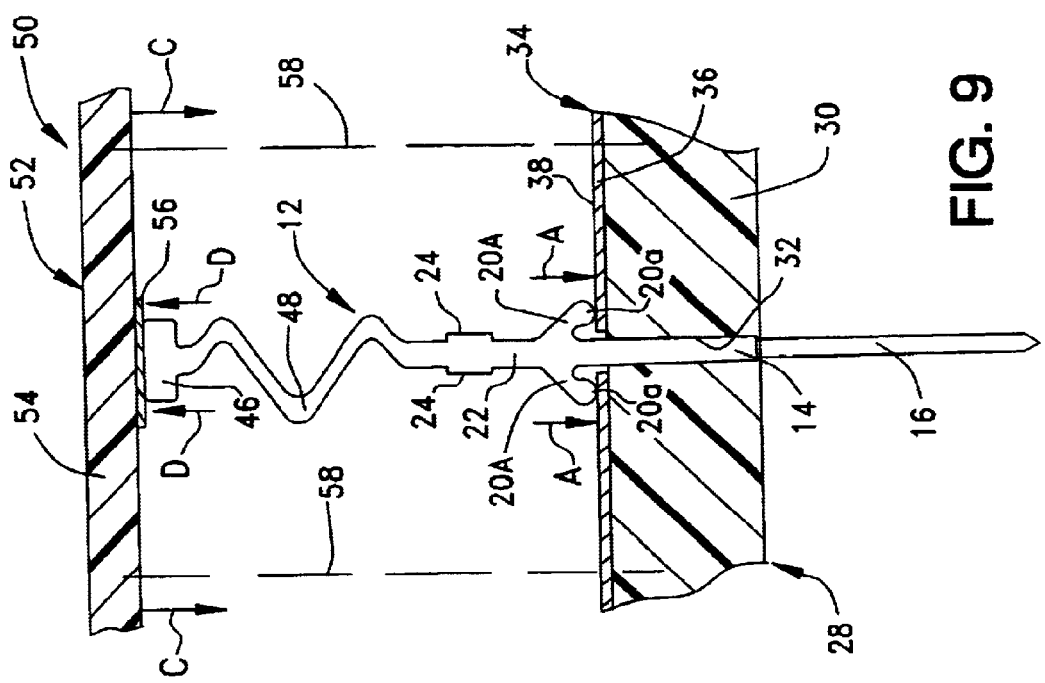
FIG. 9 is a section through a connector assembly incorporating the connector of FIG. 6 with the terminal of FIG. 8, and in combination with a second flat circuit connecting device.

Terminal 12 of FIG. 8 is shown in FIG. 9 in a connector assembly, generally designated 50, which includes connector 28 of FIG. 6 in combination with a second flat circuit in the form of a rigid printed circuit board, generally designated 52. Flat circuit 52 includes a dielectric substrate 54 having a conductor 56 on the bottom thereof. Flat circuit 52 is assembled to connector 28 by appropriate fasteners indicated by dotted lines 58. The fasteners may be of a type capable of drawing second flat circuit 52 toward connector 28 and first flat circuit 34 in the direction of arrows "C". In such an assembly, drawing second flat circuit 52 toward first flat circuit 34 in the direction of arrows "C" is effective to compress spring portion 48 of terminal 12. The spring portion, in turn, is effective to exert reactive forces in opposite directions longitudinally or axially of terminal 12. The result is that the spring portion will bias contact tips 20a of wing portions 20A compressively into engagement with conductor 38 of first flat circuit 34, while head portion 46 of the terminal is compressively biased into engagement with conductor 56 of second flat circuit 52.

FIG. 10 shows a connector assembly, generally designated 60, which employs one or more terminals 12 similar to the application described above in relation to FIG. 9. Connector assembly 60 includes a peripheral housing 62 which may be a machine cast component. The housing has an enlarged opening 64 in a bottom wall 66 thereof. The top of the housing is open and includes an inside, peripheral lip 68. A cover 70 closes the top of the housing and rests on top of lip 68. The cover may be permanently adhered to the housing or appropriately removably attached thereto. Connector assembly 60 is a "power" connector, and a ceramic circuit board 72 is fixed to a bottom inside face 73 of cover 70. Therefore, the cover is fabricated of such material as aluminum to provide a heat sink for the power circuit board 72. The circuit board is a ceramic board because of its high heat transfer capability. Such a connector assembly as connector assembly 60 may be used as a power control module in conjunction with a computer for an automobile, for instance, and there may be as many as 100 terminals 12 within the module. Only one terminal is shown in FIG. 10 in order to reasonably facilitate the illustration.

With that understanding, a dielectric circuit support member 30 is mounted within opening 64 in bottom wall 66 of housing 62. In other words, support member 30 is equivalent to support member 30 described above in relation to connector 28 in FIG. 4 and subsequent embodiments. In connector assembly 60, support member 30 may be a plastic member insert molded within opening 64 of the housing. The support member has a receptacle 74 integrally molded with the bottom thereof for receiving a mating wiring harness to be electrically coupled to contact pins 16 of terminals 12. A flat circuit 34 is mounted to a top inside face 75 of support member 30. Therefore, cover 70 forms a top circuit support structure and support member 30 forms a bottom circuit support structure of connector assembly 60.

In connector assembly 60 of FIG. 10, flat circuit 34 is a filter circuit which includes a plurality of chip capacitors 76 coupled to the conductor traces on the flat circuit. As with the embodiments of FIGS. 1–9, wing portions 20A of terminals 12 engage the conductors on the flat circuit. As with the embodiment of FIG. 9, head portions 46 of terminals 12 engage conductors on ceramic circuit board 72, while wing portions 20A engage conductors on flat circuit 34, and with spring portions 48 of the terminals biasing the head portions and the wing portions in opposite directions. Contact pins 16 project into receptacle 74 for engaging contacts of the mating wiring harness.

With connector assembly 60 being a filter connector, an enlarged ferrite filter block 80 is supported on a plurality of upstanding posts 82 of support member 30. The ferrite filter block has a plurality of holes 84 through which terminals 12 freely pass. A curable encapsulant 86 is used within the assembly to hold the ferrite filter block, filter circuit 34 and any other components securely within the inside of the assembly.

FIGS. 11 and 12 show different configurations of head portions 46 of terminal 12. In FIG. 11, the head portion has a rounded concave surface 90 for engaging second flat circuit 72 of connector assembly 60 in FIG. 10, or for engaging conductor 56 of second flat circuit 52 in FIG. 9. This rounded surface facilitates providing a positive engagement should the head portion tilt of "rock" for any reason. The head portion in FIG. 12 includes a pair of bumps 92 to provide a more positive engagement with the second flat circuit than would be provided with a larger flat surface.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. An electrical connector for a flat circuit, the flat circuit having which has a flat dielectric substrate with at least one pin-receiving hole therein and a conductor on a side thereof about the hole, the connector comprising:

a dielectric circuit support member for supporting the flat circuit substrate on one side thereof with the conductor of the flat circuit facing away the support member, the support member having a pin-receiving hole for registry with the pin-receiving hole in the flat circuit;

a conductive terminal having a pin portion insertable from said one side of the support member through the hole in the flat circuit and into the hole in the support member, and a laterally projecting wing portion for engaging the conductor on the flat circuit;

cross-dimensions of the pin portion being sized relative to the hole in the flat circuit substrate such that the pin portion is spaced apart from the substrate and the flat circuit conductor when the pin portion is inserted into the hole in the substrate with the substrate supported by the support member; and said hole in the support member being sized relative to the cross-dimensions of the pin portion of the terminal to establish interference fit therebetween and to maintain the wing portion of the terminal in compressive engagement with the conductor of the flat circuit.

2. The electrical connector of claim 1 wherein said circuit support member is fabricated of plastic material and said terminal is fabricated of metal material.

3. The electrical connector of claim 2 wherein said terminal is stamped of conductive sheet metal material.

4. The electrical connector of claim 1 wherein said terminal has a pair of said wing portions projecting laterally from opposite sides thereof.

5. The electrical connector of claim 1 wherein said terminal defines a longitudinal axis running lengthwise through said pin portion, and said wing portion is formed at an angle to the axis and at an angle to the flat circuit to provide a spring characteristic in the wing portion.

6. The electrical connector of claim 5 wherein said terminal has a pair of said wing portions projecting laterally from opposite sides thereof.

7. The electrical connector of claim 1, including a resilient layer sandwiched between the flat circuit and said one side of the circuit support member.

8. The electrical connector of claim 1 wherein said terminal includes a contact pin extending coaxially from said pin portion beyond an opposite side of the support member for interconnection to a contact of an appropriate complementary connecting device.

9. The electrical connector of claim 8 wherein the cross-dimensions of said contact pin are less than the size of the hole in the circuit support member so that the contact pin does not engage the inside of the hole when the pin portion of the terminal is inserted into the hole.

10. The electrical connector of claim 1 wherein said terminal includes a head portion joined to the pin portion by a spring portion extending away from said one side of the circuit support member, the head portion being configured for engaging a conductor of a complementary electrical device.

11. The electrical connector of claim 10 wherein said head portion has a flat surface generally parallel to said one side of the circuit support member for engaging a conductor of a second flat circuit.

12. The electrical connector of claim 1 wherein said terminal is stamped of sheet metal material with at least one laterally projecting shoulder portion spaced from said wing portion for engagement by an appropriate tool to facilitate inserting the pin portion of the terminal into the hole in the circuit support member.

13. In combination with the electrical connector of claim 1, including a flat flexible circuit positioned between the support member and the terminal wing portion, wherein the wing portion is in compressive engagement with the conductor of the flat circuit.

14. An electrical connector for a flat circuit, the flat circuit having which has a flat dielectric substrate with at least one pin-receiving hole therein and a conductor on a side thereof about the hole, the connector comprising:

a dielectric circuit support member fabricated of plastic non conductive material for supporting the flat circuit on one side thereof with the conductor of the flat circuit facing away from the support member, the support member having a pin-receiving hole for registry with the pin-receiving hole in the flat circuit;

a conductive terminal stamped of conductive sheet metal material and having a pin portion insertable from said one side of the support member through the hole in the flat circuit and into the hole in the support member, a pair of laterally projecting wing portions for engaging the conductor on the flat circuit, and a contact pin extending coaxially from the pin portion beyond an opposite side of the support member for interconnection to a contact of an appropriate complementary connecting device;

cross-dimensions of the pin portion being sized relative to the hole in the flat circuit substrate such that the pin portion is spaced apart from the substrate and the flat circuit conductor when the pin portion is inserted into the hole in the substrate with the substrate supported by the support member; and said hole in the support member being sized relative to the cross-dimensions of the pin portion of the terminal to establish an interference fit therebetween and to maintain the wing portion of the terminal in compressive engagement with the conductor of the flat circuit; and the cross-dimensions of said contact pin being less than the size of the hole in the circuit support member so that the contact pin does not engage the inside of the hole when the pin portion of the terminal is inserted into the hole.

15. The electrical connector of claim 14 wherein said terminal defines a longitudinal axis running lengthwise through said pin portion, and said wing portions are formed at an angle to the axis and at an angle to the flat circuit to provide a spring characteristic in the wing portion.

16. The electrical connector of claim 14, including a resilient layer sandwiched between the flat circuit and said one side of the circuit support member.

17. The electrical connector of claim 14 wherein said terminal includes a head portion joined to the pin portion by a spring portion extending away from said one side of the circuit support member, the head portion being configured for engaging a conductor of a complementary electrical device.

18. The electrical connector of claim 17 wherein said head portion has a flat surface generally parallel to said one side of the circuit support member for engaging a conductor of a second flat circuit.

19. The electrical connector of claim 17 wherein said terminal includes at least one laterally projecting shoulder portion spaced from said wing portion for engagement by an appropriate tool to facilitate inserting the pin portion of the terminal into the hole in the circuit support member.

20. In combination with the electrical connector of claim 14, including a flat flexible circuit positioned between the support member and the terminal wing portion, wherein the wing portion is in compressive engagement with the conductor of the flat circuit.

* * * * *